United States Patent [19]

Hirano et al.

[11] Patent Number: 5,567,983
[45] Date of Patent: Oct. 22, 1996

[54] SEMICONDUCTOR APPARATUS CAPABLE OF COOLING A SEMICONDUCTOR ELEMENT WITH RADIATION EFFICIENCY

[75] Inventors: Naohiko Hirano; Yasuhiro Yamaji, both of Kawasaki, Japan

[73] Assignee: Kabushiki Kaisha Toshiba, Kawasaki, Japan

[21] Appl. No.: 466,705

[22] Filed: Jun. 6, 1995

Related U.S. Application Data

[63] Continuation of Ser. No. 179,715, Jan. 11, 1994, abandoned.

[30] Foreign Application Priority Data

Apr. 5, 1993 [JP] Japan .................................. 5-101911

[51] Int. Cl.$^6$ .......................... H01L 23/34; H01L 23/02
[52] U.S. Cl. ........................ 257/722; 257/686; 257/723
[58] Field of Search ..................................... 257/686, 722, 257/723

[56] References Cited

U.S. PATENT DOCUMENTS 5,361,188  11/1994  Kondou et al. .......................... 257/712
5,444,296  8/1995  Kaul et al. ............................... 257/686

FOREIGN PATENT DOCUMENTS 3-074864  3/1991  Japan ..................................... 257/721

*Primary Examiner*—Sara W. Crane
*Assistant Examiner*—T. M. Arroyo
*Attorney, Agent, or Firm*—Finnegan, Henderson, Farabow, Garrett & Dunner, L.L.P.

[57] ABSTRACT

A heat sink is attached to a semiconductor element functioning as an exothermic element, which is mounted on a circuit board and has a predetermined allowable power consumption, thereby cooling the semiconductor element. A semiconductor element having a lower allowable power consumption than the semiconductor element having the predetermined power consumption, which is hardly exposed to a cooling air flow cooled via the heat sink, is connected to a heat conductive auxiliary member connected at one end to the heat sink. Thus, the heat radiation efficiency of the semiconductor element having the lower allowable power consumption is enhanced.

2 Claims, 6 Drawing Sheets

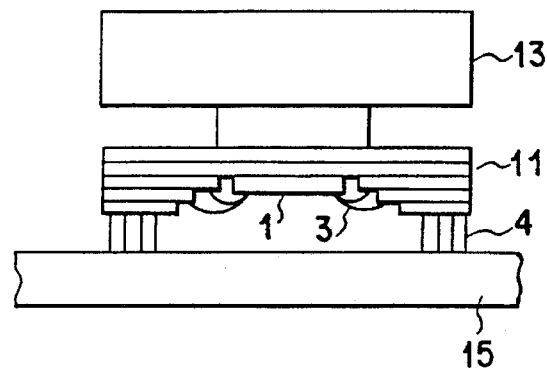
F I G. 13
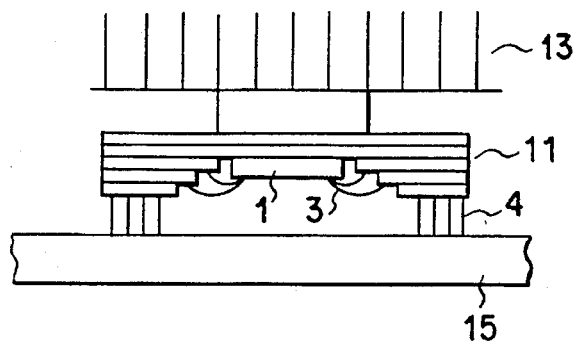
F I G. 14
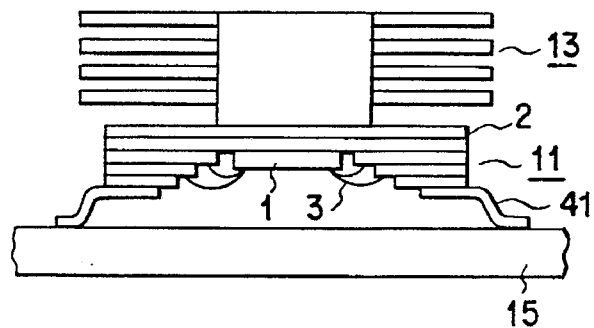
F I G. 15

5,567,983

SEMICONDUCTOR APPARATUS CAPABLE OF COOLING A SEMICONDUCTOR ELEMENT WITH RADIATION EFFICIENCY

This is a continuation of U.S. patent application Ser. No. 08/179,715, filed Jan. 11, 1994, now abandoned.

BACKGROUND OF THE INVENTION

1. Field of the Invention

The present invention relates to a semiconductor apparatus with high integration density, which is capable of effectively cooling a semiconductor element with low radiation efficiency.

2. Description of the Related Art

A conventional semiconductor apparatus comprising mainly a plurality of semiconductor elements mounted on a circuit board such as a printed circuit board or a ceramic board consumes much power and is equipped mixedly with high-power-consuming, highly exothermic semiconductor elements (hereinafter referred to as "exothermic element") and semiconductor elements having less power consumption than the exothermic element and having not so high exothermic properties (hereinafter referred to as "IC element"). Normally, the packages of all exothermic elements are provided with heat sinks such as cooling fins. Recently, the exothermic density has remarkably increased due to an increase in integration of the semiconductor element itself and an increase in density of integration of semiconductor elements. Accordingly, the cooling of the semiconductor apparatus is a serious problem.

An example of a semiconductor apparatus having the conventional cooling structure will now be described with reference to FIG. 1 (plan view) and FIG. 2 (partial cross-sectional view). Some semiconductor apparatuses are combined into a single system having a predetermined function. The system is provided with a cooling apparatus for forcibly producing an air flow. The cooling apparatus introduces an air wind into the system, thereby dissipating heat generated by a semiconductor apparatus situated at a predetermined position within the system, as shown in FIG. 1.

A wiring pattern such as a Cu layer is formed on a major surface of a circuit board 15 such as a printed circuit board (PCB). Semiconductor elements mounted on the circuit board 15 are connected to the wiring pattern. On the circuit board 15, an exothermic element 11 is situated at a position where the air flow can be utilized most effectively. An IC element 12 and peripheral circuits (not shown) are formed on the other region. A cooling fin 13 with high heat radiation properties is attached to the surface of the package of the exothermic element 11 such as a CPU which must be designed most deliberately in terms of thermal properties. The cooling fin 13 receives an air flow 16 produced from a cooling device 20 attached to the system, thus radiating heat from the exothermic element 11. The IC element 12 such as a memory with not so high exothermic properties is not equipped with a cooling fin. As is shown in FIG. 2, in the IC element 12, a semiconductor chip 5 is coated and protected by a resin-mold package 6. The resin-mold package 6 may be replaced by a ceramic package or a laminated-ceramic package. The semiconductor chip 5 is fixed to a chip-mounting portion 7 formed from a lead frame, the chip 5 and leads 8 of the lead frame are connected by bonding wires 9. The semiconductor chip 5, as well as the chip-mounting portion 7, bonding wires 9 and portions of the leads 8, is coated in the package 6. In this prior art, a laminated ceramic package is used for the exothermic element 11.

In the laminated ceramic package, since wiring can be formed on laminated ceramic substrates, multi-layer wiring can be formed and an exothermic element with high integration density can be mounted. The cooling fin 13 is attached to the bottom surface (facing upwards) of the laminated ceramic package 2 formed of, e.g. alumina. The package 2 is made of a laminated ceramic material, and wiring patterns (not shown) are formed between layers of the ceramic material. As the semiconductor elements are integrated at higher density, the number of laminated layers increases. A semiconductor chip 1 is mounted at a center portion of the package 2. The integrated circuit formed within the semiconductor chip 1 and the laminated wiring pattern formed within the package 2 are connected by bonding wires 3. Pin leads (PGA: Pin Grid Array) 4 vertically erected on that surface of the package 2, which faces the circuit board 15, are employed as means for connection between the wiring patterns and external circuits. A plurality of arrays of pin leads 4 are arranged along each side of the package 2. The tip ends of the pin leads 4 are connected to wiring (not shown) formed on the circuit board 15.

If the exothermic density of the semiconductor elements increases remarkably in accordance with the improvement of integration density of semiconductor elements themselves and the density of mounting of the semiconductor devices, as mentioned above, it becomes necessary to deal with the heat of the IC elements even if the amount of heat is small, in particular, in the case where the IC elements are located on that region of the circuit board, which has a low heat radiation efficiency. For example, in FIGS. 1 and 2, a wind 16 is blown from the cooling device 20 from the left to the right. The wind, which has passed by the exothermic element 11 on the circuit board 15, has absorbed heat of the exothermic element and the temperature thereof increases. Thus, the efficiency for absorbing heat of the IC elements 12 situated on the right of the exothermic element is low. Although the heat of the IC elements 12 situated on the left of the exothermic element 11 is sufficiently absorbed, the heat of the IC elements 12 situated on the right of the exothermic element 11 are not sufficiently absorbed and consequently the characteristics of the semiconductor apparatus deteriorate. Specifically, with the higher operation speed and higher integration density of the semiconductor apparatus, there may be a case where even IC elements with a power consumption lower than a predetermined power consumption of an exothermic element must be efficiently cooled in order to enhance the reliability of the entire system. In particular, in order to increase the density for mounting of elements, a memory such as an SRAM tends to be situated near a CPU where the cooling efficiency is very low. Although the generated heat must be dealt with, the heat has not yet been dealt with sufficiently.

However, it is not practical to attach a heat sink to each of semiconductor elements or to attach a heat sink commonly to all semiconductor elements of a semiconductor apparatus, since this causes an increase in cost, a decrease in mounting density, and complexity in structure.

SUMMARY OF THE INVENTION

The present invention has been made in consideration of the above circumstances, and its object is to provide a semiconductor apparatus wherein a cooling member for an exothermic semiconductor element having a predetermined allowable power consumption and a semiconductor element having a lower allowable power consumption and situated at a position where the heat radiation efficiency is low are connected by means of a heat conductive auxiliary member, whereby the cooling effect of the semiconductor element with the lower allowable power consumption is enhanced.

In order to achieve the above object, there is provided a semiconductor apparatus comprising:

a circuit board;

at least one semiconductor element mounted on the circuit board and having a predetermined allowable power consumption;

a heat sink, attached to the semiconductor element, for cooling the semiconductor element having the predetermined allowable power consumption;

a semiconductor element mounted on the circuit board and having a lower allowable power consumption than the semiconductor element having the predetermined allowable power consumption; and a heat conductive auxiliary member formed of a material with a predetermined thermal conductivity, one end of which is connected to the heat sink, and the other end of which is connected to the semiconductor element having the lower allowable power consumption than the semiconductor element having the predetermined allowable power consumption.

In the semiconductor apparatus of the present invention having this structure, the cooling effect of the semiconductor element, which has a low allowable power consumption and is situated in such a position that the semiconductor element, is hardly exposed to the cooling air can be enhanced.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13 is a front view schematically showing the structure of a semiconductor apparatus having a so-called rectangular cooling fin, which is attached to the semiconductor element or exothermic element in the present invention;

FIG. 14 is a view schematically showing the structure of the semiconductor apparatus, with the rectangular cooling fin shown in FIG. 13 viewed from a side face thereof; and FIG. 15 shows an example wherein wiring formed in the package and wiring formed on the circuit board are connected by means of leads.

DETAILED DESCRIPTION OF THE PREFERRED EMBODIMENTS

Embodiments of the present invention will now be described.

Figure 1:
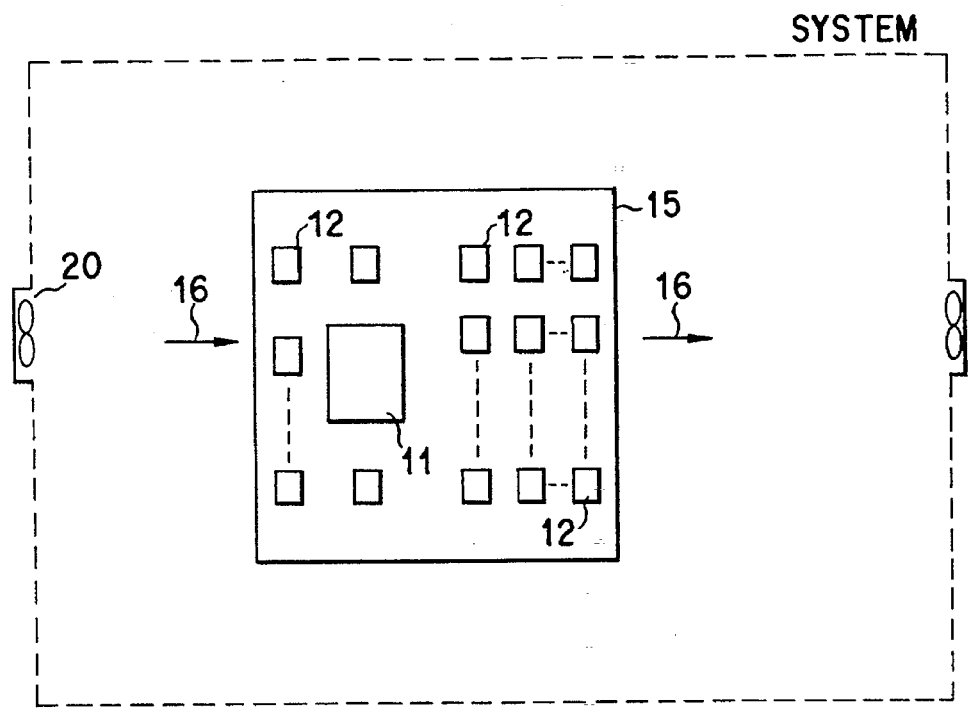
FIG. 1 is a plan view showing the arrangement of elements on a semiconductor circuit board situated within a conventional cooling system.
Figure 2:
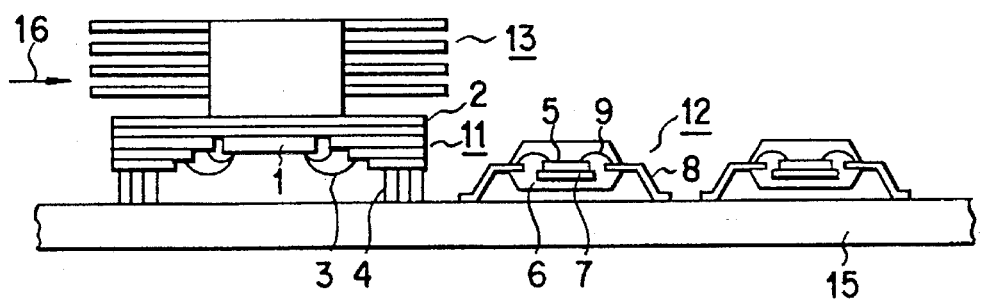
FIG. 2 is a partial cross-sectional view showing a conventional semiconductor apparatus having a base plate on which semiconductor elements and a cooling fan are mounted.
Figure 3:
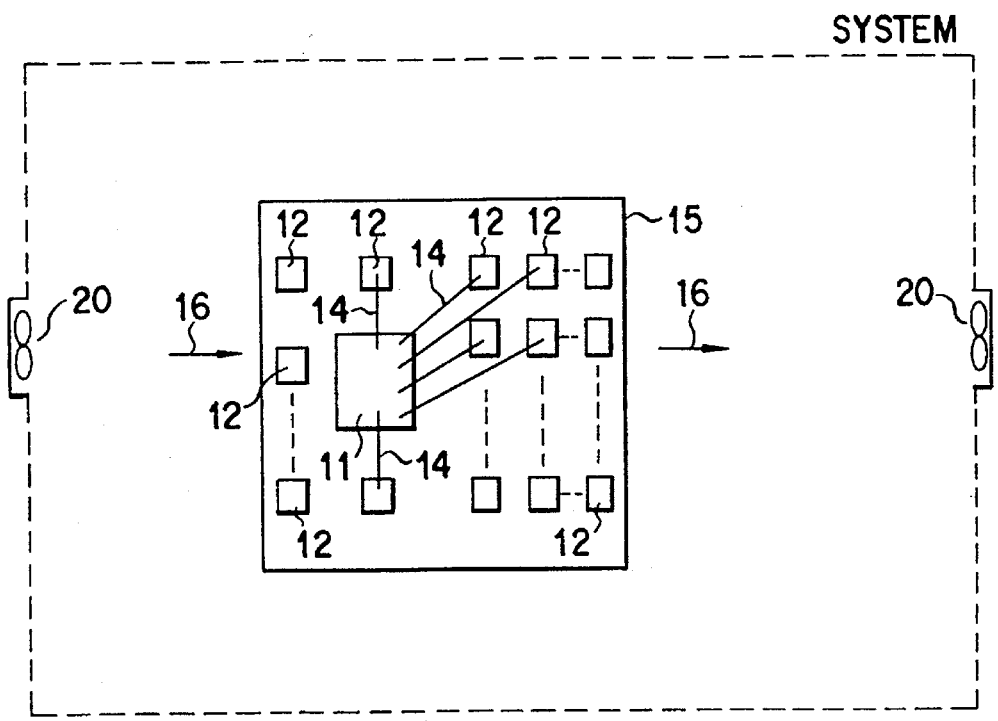
FIG. 3 is a plan view showing the arrangement of elements on a semiconductor circuit board situated within a cooling system according to the present invention.
Figure 4:
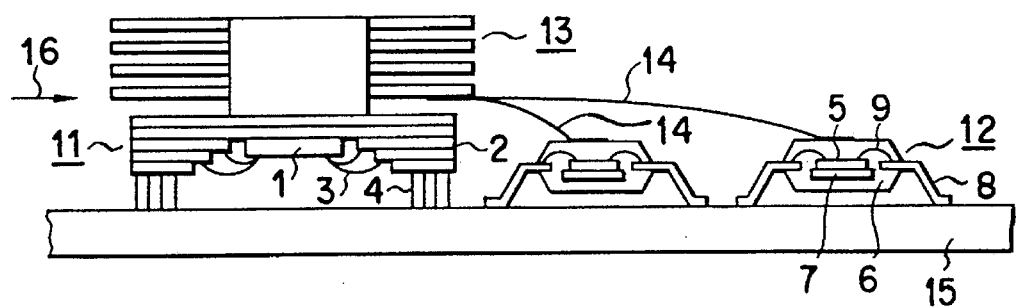
FIG. 4 is a partial side view-showing a semiconductor apparatus according to a first embodiment of the present invention.

A first embodiment of the present invention will now be described with reference to FIGS. 3 and 4. FIG. 3 is a plan view showing a semiconductor apparatus situated within a system, and FIG. 4 is a partial side view showing this semiconductor apparatus. A plurality of semiconductor apparatuses are combined to constitute a single system having a predetermined function. As is shown in FIG. 3, this system is equipped with a cooling device 20 for forcibly producing an air flow 16. The air flow 16 is produced within the system by the cooling device 20, thereby eliminating heat produced from the semiconductor apparatuses. A wiring pattern (not shown) such as a Cu pattern is formed on a major surface of a circuit board 15 such as a printed circuit board (PCB). Semiconductor elements mounted thereon are connected by means of this wiring pattern. An exothermic element 11 is situated on the circuit board 15 at such a position that the air flow 16 can be effectively utilized, and integrated circuit (IC) elements and peripheral circuits (not shown) are formed on other regions on the circuit board 15. The package surface of the exothermic element 11 (e.g. CPU), which must be designed most deliberately in terms of thermal properties, is equipped with a cooling fin 13 made of, e.g. aluminum having high heat radiation properties, as shown in FIG. 4. The cooling fin 13 receives the air flow 16 produced from the cooling device 20 attached to the system, thus dissipating the heat of the exothermic element 11.

Each IC element 12 such as a memory with not so high exothermic properties is not equipped with a cooling fin. As shown in the plan view of FIG. 3, the IC elements 12 situated on the left side of the exothermic elements 11 receives the air flow 16 with good cooling properties. However, the heat radiation properties of the IC elements 12 situated on the right side of the exothermic elements 11 are degraded because of the presence of the air 16 whose temperature has risen due to the heat of the exothermic element 11. In order to solve this problem, in this embodiment, heat conductive auxiliary members 14, such as aluminum ribbons, are attached to the IC elements 12 arranged on that region of the circuit board 15, the heat radiation properties of which are not good. Distal end portions of the auxiliary members 14 are connected to the cooling fin 13 of the exothermic element 11 situated adjacent to the IC elements. Thus, the heat radiation properties of the IC elements 12 in this region are enhanced. FIG. 4 is a partial side view of that region of the circuit board 15 which includes the exothermic element 11. The cooling fin 13 is attached to the bottom surface (facing upwards) of the laminated ceramic package 2 made of, e.g. alumina. The package 2 comprises laminated ceramic layers, and wiring patterns (not shown) are formed between the layers. Accordingly, as the integration density of semiconductor elements increases, the number of lamination layers increases. A semiconductor chip 1 is mounted at a center of the package 2.

An IC formed in the semiconductor chip 1 is connected to the laminated wiring patterns formed in the package 2 by means of bonding wires 3. Pin leads (PGA) 4 vertically erected on that surface of the package 2, which faces the circuit board 15, are employed as means for connection between the wiring patterns and external circuits. A plurality of arrays of pin leads 4 are arranged along each side of the package 2. These arrays may be arranged along a single pair of opposite sides alone. The tip ends of the pin leads 4 are connected to wiring (not shown) formed on the circuit board 15. The package 2 for the exothermic element 11 may be a ceramic package made of, e.g. alumina, or a resin-mold package. IC elements 12 such as memories of SRAM, the power consumption of which is low, are attached on the circuit board 15 in the vicinity of the exothermic element 11. In each IC element 12, the semiconductor chip 5 is coated and protected by a resin-mold package 6. The chip 5 is mounted, e.g. on a lead frame. The semiconductor chip 5 is attached to a chip-mounting portion 7 of the lead frame, and the chip 5 and one end of each lead 8 of the lead frame are connected by means of a bonding wire 9.

The bonding wire 9, one end of each lead 8 and chip-mounting portion are also coated and protected by a resin mold. The other end of the lead 8 is connected to wiring pattern (not shown) on the circuit board 15. As is shown in FIG. 4, the IC element 12 is formed by using the resin-mold package 6 in which the semiconductor chip 5 attached to the lead frame is resin-molded, but the resin-mold package 6 may be replaced by a ceramic package or a laminated ceramic package. The heat conductive auxiliary members 14 are attached to the IC elements 12 situated on the downstream side of the exothermic element 11 in the direction of the air flow 16, where the heat radiation efficiency is degraded.

Materials with high thermal conductivity for the heat conductive auxiliary members include a metal such as Cu or Al as inorganic material, and a nitride such as AlN. It is also possible to use an organic insulative material with high thermal conductivity such as a silver-particle-dispersed epoxy resin or a potting resin. In addition, the shape of the heat conductive auxiliary member is not limited to a linear ribbon, as employed in the present embodiment, but it may be a U-shaped ribbon or a v-shaped ribbon, or a plate spring. The ribbons of the heat conductive auxiliary members shown in the figures have difference lengths. However, the lengths of the ribbons on a single circuit board may be made uniform. If the ribbon is too long, wiring in the manufacturing process becomes difficult and the semiconductor apparatuses must be treated carefully.

Figure 5:
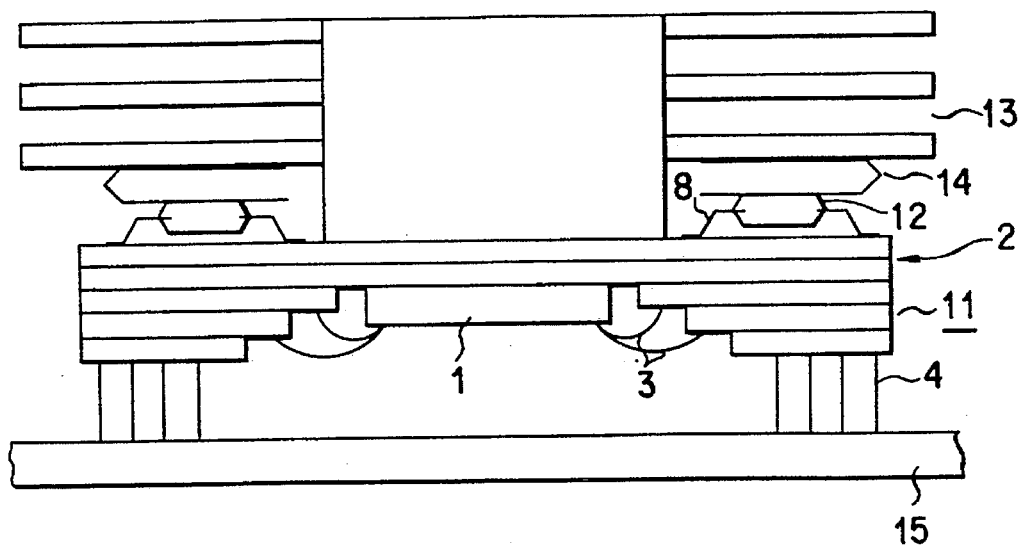
FIG. 5 is a partial side view showing a semiconductor apparatus according to a second embodiment of the invention.

A second embodiment of the invention will now be described with reference to FIG. 5. FIG. 5 is a partial side view of the semiconductor apparatus. Like the semiconductor apparatus shown in FIG. 3 (plan view), the exothermic element 11 and IC elements 12 are mounted on the circuit board 15. The second embodiment differs from the embodiment shown in FIG. 3 in that MCM (Multi-Chip Module) type semiconductor elements are employed wherein IC elements are attached on the package of the exothermic element 11. Needless to say, some IC elements 12 are directly attached on the circuit board 15. The circuit board 15 is, e.g. a printed circuit board (PCB), and, for example, a Cu layer is formed as a wiring pattern on a major surface of the circuit board. The semiconductor elements are connected to the wiring pattern. The package surface of the exothermic element 11 (e.g. CPU), which must be designed most deliberately in terms of thermal properties, is equipped with a cooling fin 13 having high heat radiation properties. IC elements 12 such as memories having not so high heat radiation properties, which are arranged in the vicinity of the exothermic element 11, are attached on a wiring pattern (not shown) formed on the surface of the package of the exothermic element 11. In addition, such IC elements 12 may be formed directly on the circuit board 15. Heat conductive auxiliary members 14 made of, e.g. aluminum ribbons with good thermal conductivity are attached on the packages of the IC elements 12. The heat conductive auxiliary members 14 are connected to desired portions of the cooling fin 13.

with this structure, the degree of integration of the semiconductor apparatus can enhanced remarkably, and the cooling efficiency of the IC elements 12 situated on the region with a very low cooling efficiency can be greatly increased. The heat conductive auxiliary members 14, however, are not attached to IC elements 12 which are situated on the circuit board 15 at areas farthest from the exothermic element 11 (see FIG. 3), since these IC elements 12 are exposed to cool air 16. In this second embodiment, the cooling fin 13 is made of, e.g. aluminum. In the case where the cooling fin 13 and heat conductive auxiliary members 14 are made of the same material, as stated above, the heat conductive auxiliary members 14 can be made along with the cooling fin 13 as one unit. The IC element 12 is interposed between the heat conductive auxiliary member 14 attached to the bottom of the cooling fin 13 and the package 2 of the exothermic element 11, and the IC element 12 is connected to both the package 2 and heat conductive auxiliary member 14. The heat conductive auxiliary member 14 is not limited to the ribbon, but it may be a U-shaped spring or V-shaped spring formed from an aluminum plate. The IC element 12 is coated in a resin-mold package, with the same structure as in the first embodiment. Thus, the package alone is shown, and the description of the internal parts is omitted. The exothermic element 11 has the same structure as in the first embodiment. The second embodiment is suitably applicable to a small-sized, high-density semiconductor apparatus, since the IC elements 12 are mounted on the exothermic element 11.

Figure 6:
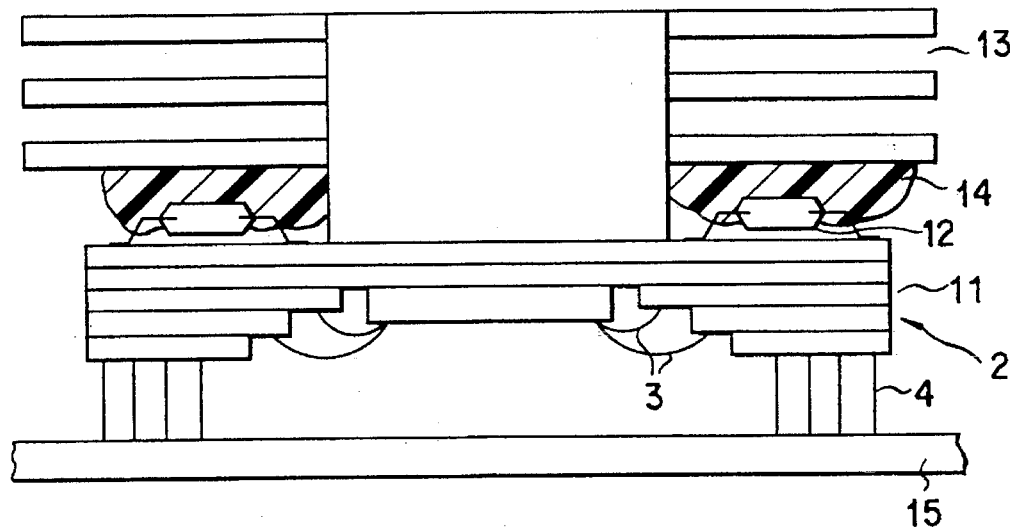
FIG. 6 is a partial side view showing a semiconductor apparatus according to a third embodiment of the invention.

A third embodiment of the invention will now be described with reference to FIG. 6. FIG. 6 is a partial side view of the semiconductor apparatus. In the third embodiment, like the second embodiment, the MCM type semiconductor elements wherein IC elements 12 are resin-molded on the laminated ceramic package 2 of the exothermic element 11 are employed. Needless to say, some IC elements are directly attached to the circuit board 15. The circuit board 15 is, e.g. a PCB, and a Cu layer is formed as a wiring pattern on a major surface of the circuit board 15. The IC elements 12 are connected to the wiring pattern. The package surface of the exothermic element 11 (e.g. CPU) is equipped with a cooling fin 13 having high heat radiation properties. IC elements 12 such as memories having not so high heat radiation properties, which are arranged in the vicinity of the exothermic element 11, are attached on a wiring pattern (not shown) formed on the surface of the package 2 of the exothermic element 11. In addition, such IC elements 12 may be formed directly on the circuit board 15. In the third embodiment, the heat conductive auxiliary members 14 are characterized by being formed of an organic material. After the IC element 12 is attached on the exothermic element 11, an insulative epoxy resin in which, e.g. silver particles are mixed, is injected, and the injected material is employed as heat conductive auxiliary member 14. The epoxy resin may be replaced by a potting resin. In this case, the resin may be applied to a narrower space than in the case of solid heat conductive auxiliary member 14. Furthermore, the attachment is easier than in the case of the solid member.

With this structure, the integration density of the semiconductor apparatus can be enhanced remarkably, and the cooling efficiency of the IC elements 12 situated on the region with a very low cooling efficiency can be greatly increased.

Figure 7:
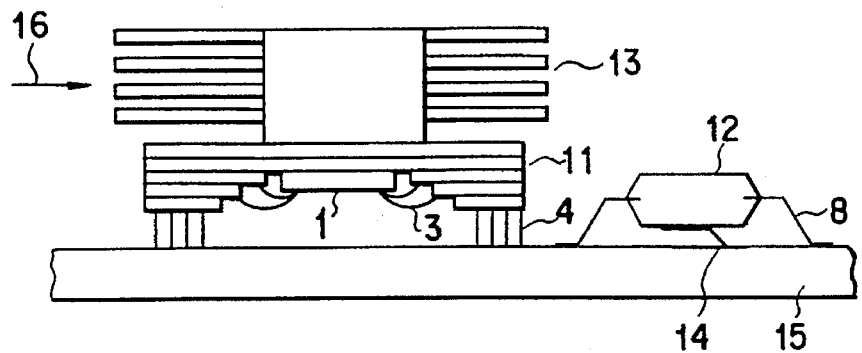
FIG. 7 is a partial side view showing a semiconductor apparatus according to a fourth embodiment of the invention.

A fourth embodiment of the invention will now be described with reference to FIG. 7. FIG. 7 is a partial side view of the semiconductor apparatus. A Cu layer is formed as a wiring pattern (not shown) on a major surface of the circuit board 15. An exothermic element 11 and an IC element 12 are connected to the wiring pattern. The surface of the laminated ceramic package of the exothermic element 11 such as a CPU is equipped with a cooling fin 13. A wind (air flow) 16 is fed to the circuit board 15 from the system. The wind flows from the left to the right in FIG. 7. The wind which has absorbed heat from the exothermic element and thus has a raised temperature, flows on the downstream side of the exothermic element 11. Consequently, the downstream side of the exothermic element 11 is a region with a low heat radiation efficiency. Heat conductive auxiliary members 14 are attached to the IC elements 12 arranged on this region with low heat radiation efficiency. Heat is dissipated through the auxiliary members. In this fourth embodiment, the circuit board 15 is a PCB with good heat conductive properties, and the heat conductive auxiliary members 14 are connected to the circuit board 15. Since the heat conductive auxiliary members 14 are connected to the circuit board, it is not necessary to make the heat conductive auxiliary members 14 too long. In addition, since each heat conductive auxiliary member 14 is situated just below the IC element 12, a large space is not occupied.

Figure 8:
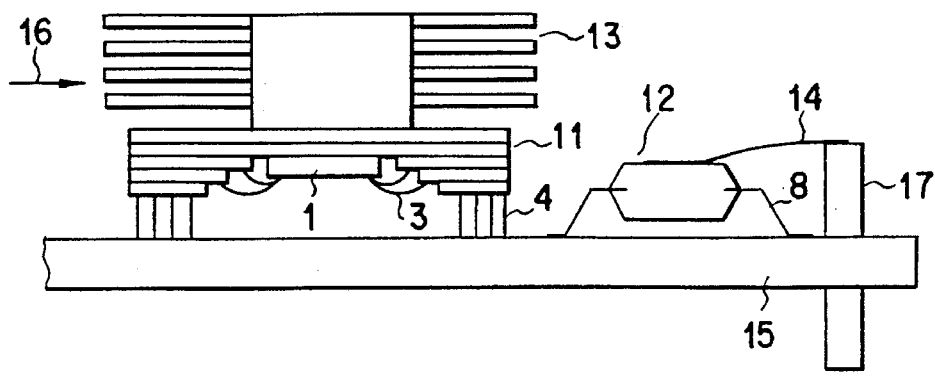
FIG. 8 is a partial side view showing a semiconductor apparatus according to a fifth embodiment of the invention.

A fifth embodiment of the invention will now be described with reference to FIG. 8. FIG. 8 is a partial side view of the semiconductor apparatus. The circuit board 15 is, e.g. a PCB, and a Cu layer is formed as a wiring pattern (not shown) on major surface of the circuit board 15. An exothermic element 11 and an IC element 12 are connected to the wiring pattern. Board support members 17 made of, e.g. a metal, may be attached at the four corners of the circuit board 15. Normally, a wind (air flow) 16 is fed from the system over the circuit board 15 in a fixed direction. As is shown in FIG. 3 (a plan view of the system including the semiconductor apparatus), the air flow is concentrated at the center of the circuit board 15. Accordingly, the amount of air flow at the four corners of the circuit board 15, where the board support members 17 are formed, is small, and therefore the heat radiation efficiency at the areas near the four corners of the circuit board 15 is low. Furthermore, as the integration density of the semiconductor apparatus increases, the exothermic element 11 is situated at an undesirable position. If the IC elements 12 situated near the board support members 17 attached to the corners of the circuit board 15 are located on the downstream side of the exothermic element 11, the heat radiation efficiency of the areas of these IC elements 12 is very low. In this fifth embodiment, heat conductive auxiliary members 14 such as aluminum ribbons, which are attached at one end to the IC elements 12 near the board support members 17, are connected at the other end to the board support members 17. Thereby, the problem in these areas is solved. Even if the heat conductive auxiliary members 14 are not forcibly attached to the cooling fin 13 of the exothermic element 11, they may be attached to nearer members and thereby the size of the semiconductor apparatus is reduced.

Figure 9:
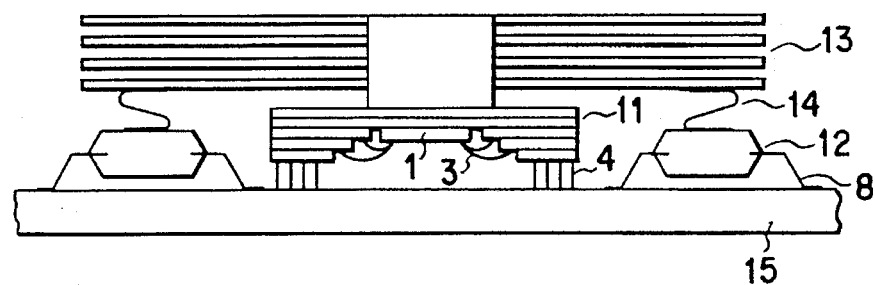
FIG. 9 is a partial side view showing a semiconductor apparatus according to a sixth embodiment of the invention.

A sixth embodiment of the invention will now be described with reference to FIG. 9. FIG. 9 is a partial side view of the semiconductor apparatus. Like the semiconductor apparatus shown in FIG. 3 (plan view), the exothermic element 11 and IC element 12 are mounted on the circuit board 15. In this embodiment, the exothermic element as employed is characterized in that the surface area of the cooling fin 13 on the package of the exothermic element is greater than that of the package. The circuit board 15 is a ceramic circuit board made of, e.g. alumina, and a Cu layer is formed as a wiring pattern on a major surface of the circuit board 15. The exothermic element 11 and IC elements 12 are connected to the wiring pattern (not shown). IC elements 12 such as memories having not so high heat radiation properties, which are arranged in the vicinity of the exothermic element 11 such as CPU, are attached to the wiring pattern (not shown) formed on the circuit board 15. As the power consumption increases, the surface area of the cooling fin 13 increases and may be greater than that of the exothermic element 11, as stated above. In this case, the region under the cooling fin 13 is not exposed to the air flow, and the heat radiation efficiency of this region is low. To solve this problem, a heat conductive auxiliary member 14 formed of an aluminum ribbon or a plate spring is attached to the surface of the IC element 12 situated under the fin, and a distal end portion of the auxiliary member 14 is connected to the fin located above. Even if the size of the cooling fin 13 increases, the circuit board 15 can be utilized effectively.

Figure 10:
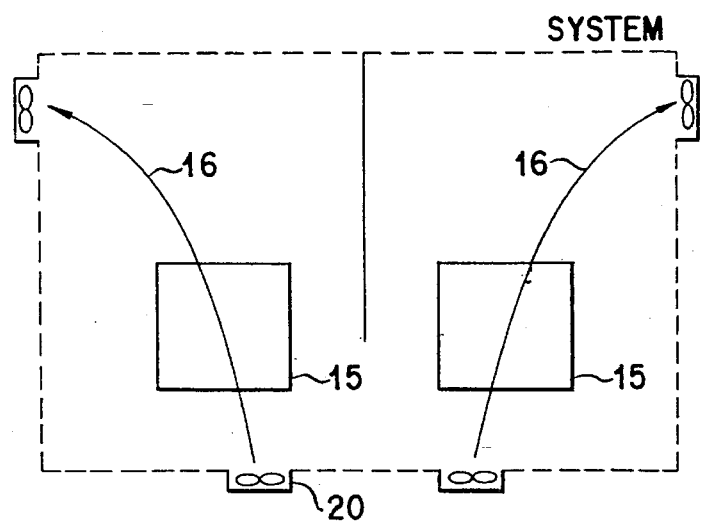
FIG. 10 is a view showing an arrangement of two semiconductor apparatuses within the cooling system of the invention.
Figure 11:
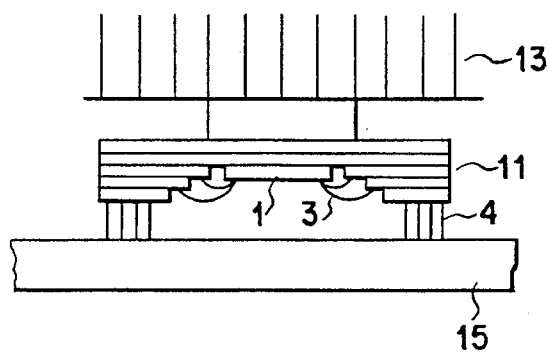
FIG. 11 is a side view schematically showing an example of the structure of a cooling fin attached to a semiconductor element or an exothermic element in the present invention.
Figure 12:
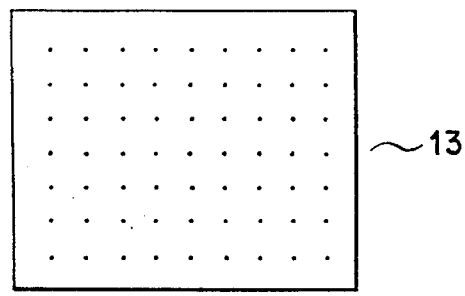
FIG. 12 is a plan view showing the cooling fin shown in FIG. 11.

FIG. 10 shows a cooling system having the semiconductor apparatus of the present invention but having a structure different from the structures of the above-described embodiments. This cooling system is divided into two regions by a center partition, and a semiconductor apparatus comprising the semiconductor apparatus of the present invention is mounted in each region. Air flows 16 are produced by cooling devices 20 into the respective regions. The air flow 16 in each region is produced from the cooling device 20 provided on one side of the system and exhausted from an adjacent side of the system. Circuit boards 15 constituting semiconductor apparatuses are situated at desired positions of the system in accordance with the air flows 16. The exothermic elements are mounted at desired positions on the circuit boards 15 so as to be exposed to the air flows 16 with high efficiency.

with reference to FIGS. 11 to 14, other examples of the cooling fin attached to the exothermic element used in the semiconductor apparatus of the present invention will now be described. FIG. 11 is a front view of a pin fin, and FIG. 12 is a plan view of the pin fin. This cooling fin 13 is constructed such that pin members are attached on the package of the exothermic element 11 in a matrix. Since the radiator members are the pin members, the exothermic element can dissipate heat sufficiently even if the wind comes from any direction. FIG. 13 is a front view of a rectangular fin, and FIG. 14 is a side view of the rectangular fin. This cooling fin 13 is constructed such that rectangular plates are attached on the package of the exothermic element 11 regularly. Since a plurality of rectangular radiator plates are provided, the heat of the exothermic element can be dissipated sufficiently by the wind in one direction. Cooling fins of other shapes can be used.

Another example of the exothermic element used in the semiconductor apparatus of the present invention will now be described with reference to FIG. 15. An exothermic element 11 and an IC element (not shown) according to the present invention are mounted on a circuit board 15 shown in FIG. 15. The exothermic element 11 is equipped with a cooling fin 13 attached to the bottom surface (facing upwards) of the laminated ceramic package 2. The package 2 comprises laminated ceramic layers, and wiring patterns (not shown) are formed between the layers. A semiconductor chip 1 is mounted at the center of the package 2. The semiconductor chip 1 and the wiring patterns formed within the package 2 are connected by bonding wires 3. Leads 41 extending in parallel to the package 2 are employed as means for connecting the wiring patterns and external circuits. Distal end portions of the leads 41 are connected to the wiring (not shown) on the circuit board 15 in parallel. The leads 41 are arranged so as to extend along each edge of the sides of the package 2. Since the area on the circuit board 15 occupied by the leads 41 is greater than that occupied by the pin leads 4 employed in the preceding embodiment, it is necessary to effectively utilize margin portions of the circuit board 15 in order to increase the integration density of the semiconductor apparatus, e.g. by arranging low-power-consumption IC elements in the space below the exothermic element 11.

As has been described above, as the integration density of the semiconductor apparatus develops, semiconductor elements must be situated in a region with a low heat radiation efficiency on a circuit board. In such a case, in the present invention, heat conductive auxiliary members are attached to low-power-consumption semiconductor elements situated in the region with low heat radiation efficiency, and the heat conductive auxiliary members are connected to a heat sink attached to a high-power-consumption semiconductor element such as an exothermic element, thereby increasing the heat radiation efficiency of the semiconductor elements. In particular, in the prior art, in an IC in which a co-processor is situated adjacent to an exothermic element such as CPU, a heat sink is not attached to the co-processor. However, the thermal properties of the processor can easily be improved by connecting the co-processor to the adjacent cooling fin of the CPU.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor apparatus comprising:

a circuit board;

an exothermic element mounted on said circuit board;

a package for covering said exothermic element;

a first semiconductor element mounted on said exothermic element and exposed to a coolant flow;

a heat sink attached to said first semiconductor element to cool said first semiconductor element by the coolant flow, said heat sink including a plurality of cooling fins to receive said coolant flow;

a plurality of second semiconductor elements mounted on said package; and a plurality of conductive auxiliary members, each connected at one end to one of said plurality of cooling fins and at the other end to one of said plurality of second semiconductor elements.

2. A semiconductor apparatus according to claim 1, wherein said conductive auxiliary member is formed of an organic material.

* * * * *